United States Patent [19]
Turner et al.

[11] Patent Number: 4,766,569
[45] Date of Patent: Aug. 23, 1988

[54] PROGRAMMABLE LOGIC ARRAY

[75] Inventors: John E. Turner, Beaverton; Gregg R. Josephson, Lake Oswego, both of Oreg.

[73] Assignee: Lattice Semiconductor Corporation, Hillsboro, Oreg.

[21] Appl. No.: 871,063

[22] Filed: Jun. 5, 1986

Related U.S. Application Data

[63] Continuation-in-part of Ser. No. 707,667, Mar. 4, 1985.

[51] Int. Cl.$^4$ .................... G11C 7/00; G11C 29/00
[52] U.S. Cl. ................... 365/185; 365/201; 340/825.83; 371/21; 364/715
[58] Field of Search ............. 365/104, 185, 189, 201; 364/715, 716; 307/465; 340/825.83; 371/21, 25

[56] References Cited

U.S. PATENT DOCUMENTS

| | | | |
|---|---|---|---|
| 4,041,459 | 8/1977 | Horninger | 340/825.83 |
| 4,490,812 | 12/1984 | Guterman | 307/465 X |
| 4,503,387 | 3/1985 | Rutledge et al. | 371/21 X |
| 4,625,311 | 11/1986 | Fitzpatrick et al. | 371/15 |
| 4,631,695 | 12/1986 | Kozlik | 364/715 |

OTHER PUBLICATIONS

"A High-Speed ESFI SOS Programmable Logic Array with an MNOS Version," K. Horninger, IEEE Journal of Solid State Circuits, vol. SC-10, No. 5, pp. 331-336, Oct. 1975.
"An Electrically Alterable PLA for Fast Turnaround-Time VLSI Development Hardware," Wood et al., IEEE Journal of Solid State Circuits, vol. SC-16, No. 5, pp. 570-577, Oct. 1981.
"Testing the EEPROM on the MC68HC11," by Alex Shaw and Clyde Browning, Paper p. 5, 1985 International Test Conference.
Product Description of Field Programmable Logic Array Devices from the Bipolar Memory Division of Signetics, Date Jan. 1983.
"Field-PLAs Simplify Logic Designs," by N. Cavlan and R. Cline, Electronic Design, Sep. 1, 1975.
"Introduction to VLSI Systems," by Carver Mead and Lynn Conway, 1980, pp. 79-82.

Primary Examiner—Joseph A. Popek
Attorney, Agent, or Firm—Roberts and Quiogue

[57] ABSTRACT

A programmable logic array is disclosed employing arrays of electrically erasable and programmable cells. The device includes a dual purpose programming circuit which is employed to provide programming data to the AND array to program the AND array cells, and to provide OR array row selection data during OR array programming, thereby eliminating the need for a separate OR array row decoder. A method and apparatus is also disclosed for efficiently testing the AND array cells and input circuitry by bulk stripe programming the array cells.

15 Claims, 4 Drawing Sheets

FIG. 4

PROGRAMMABLE LOGIC ARRAY

This is a continuation-in-part of U.S. Ser. No. 707,662, filed Mar. 4, 1985, entitled "Improved Programmable Logic Device" and having a common assignee with the present application.

BACKGROUND OF THE INVENTION

The invention relates to a programmable logic array employing electrically erasable array switches and dual purpose programming circuitry for programming both arrays of the device, and to an improved technique for testing programmable logic arrays employing electrically erasable array cells.

The conventional field programmable logic array comprises two separate arrays. The logic function performed by the two arrays is "AND OR" logic, and therefore it is conventional to designate the respective arrays as the AND array and the OR array.

The AND array is conventionally arranged as a matrix of rows coupled to input lines and columns. Each input line may selectively be connected to a column (depending on the desired logic architecture) by programming a switch in the AND array to the conductive state. Conventional devices employ bipolar technology with the switches comprising fuses or links which are selectively blown by passing a high current level and are therefore one-time programmable devices.

The preferred method of constructing an array of metal-oxide-semiconductor (MOS) devices is with a common drain, as opposed to a stack with sources and drains connected in series. Therefore, to use the common drain transistor implementation for both the AND and OR arrays, DeMorgan's theorem is applied to achieve the desired "AND OR" logic. Thus, by inverting the AND outputs (the "product terms"), as well as the AND array inputs, "AND OR" logic may be implemented with two arrays configured as OR gates. This implementation is referred to as "invert OR-invert OR" logic.

The inverters located between the arrays serve a logical function, to achieve the "AND OR" logic, and also acts as a buffer between the product term and the OR array row. The buffer characteristic of this inversion stage makes the programming of the OR array in "invert OR-invert OR" implementation more cumbersome than in an "invert OR AND" array implementation or a true "AND OR" implementation of a programmable logic array. The difficulty arises from the fact that, because of the inverters, the high voltage used to program the columns of the AND array cannot be directly placed on the rows of the OR array. Thus, separate row address decoding circuits are respectively provided for the programming of the AND array and the OR array.

As programmable logic arrays become larger, testing of the device becomes more complex and time consuming. For devices employing electrically erasable cells, the time required to program the cells is typically a large component of test time.

It would therefore represent an advance in the art to provide a programmable logic array which employs electrically erasable cells in the AND and OR arrays to provide a reconfigurable logic array.

It would also be advantageous to provide a programmable logic array with dual purpose programming circuitry for programming both the AND and OR arrays to conserve die area.

Another object of the invention is to provide an improved technique for testing programmable logic arrays employing electrically erasable cells to minimize testing time.

SUMMARY OF THE INVENTION

The foregoing and other advantages and features are provided by the invention in a programmable logic array which includes a first array having a plurality of cells arranged in rows and columns for providing first array logical outputs respectively associated with the columns of cells, and further includes a second array having a plurality of cells arranged in rows and columns for providing second array logical outputs respectively associated with the columns of cells.

The first array logical outputs are logical combinations of logical inputs respectively available at the cells of respective rows, where such logical combinations are of selectively programmed first array cells in respective columns. The second array logical outputs are logical combinations of the first array logical outputs which are respectively available at the cells of respective rows, where such logical combinations are of selectively programmed second array cells in respective columns.

A serial shift register is provided for selectively storing either (a) first array row address information and first array programming information, or (b) second array row address information and second array programming information. Row address decoding circuitry associated with the first array and responsive to the first array row address information selectively enables a selected row of the first array to be programmed pursuant to the first array row programming information stored in the serial shift register.

The programmable logic array further includes switching circuitry respectively associated with the columns of cells of the first array for controlling the first array logical outputs to alternatively provide the second array row address information as the first array logical outputs. Enabling circuitry responsive to the second array address information in the first array logical outputs enables the programming of a selected row of the second array pursuant to the second array programming information stored in the serial shift register.

A particularly important advantage of the foregoing programmable logic array is the programmability of the second array without the use of a separate row address decoder.

An improved method of testing programmable logic devices with true/complement versions of the device inputs driving the AND array is also disclosed. In a first step, the AND array cells are programmed in a single programming cycle so that all cells in alternating rows (e.g., the odd rows) contribute to the device logical outputs when interrogated and all cells in the remaining rows (e.g., the even rows) do not contribute to the device logical outputs when interrogated. In a second step, the device inputs are driven with signals resulting in the cells in each contributing row being driven by a row input signal which does not interrogate the cells in the row, and the cells in each non-contributing row being driven by an interrogating row input signal. The device logical outputs are read for a comparison against an expected output signal pattern. In subsequent steps, the status of the device input signals are then changed or toggled sequentially and the resulting output sign pattern is compared against an expected pattern to verify the operation of the contributing cells and the associated device input circuitry. The steps are then repeated with the even rows programmed to the contributing state instead of the odd rows. Thus, the operation of the array cells and row input circuitry may be verified.

BRIEF DESCRIPTION OF THE DRAWINGS

These and other features and advantages of the present invention will become more apparent from the following detailed description of an exemplary embodiment thereof, as illustrated in the accompanying drawings, in which.

DETAILED DESCRIPTION OF THE DISCLOSURE

In the following detailed description and in the several figures of the drawing, like elements are identified with like reference numerals.

Also, the AND function is identified with an asterisk (*), and the OR function is identified with a plus sign (+).

Figure 1:
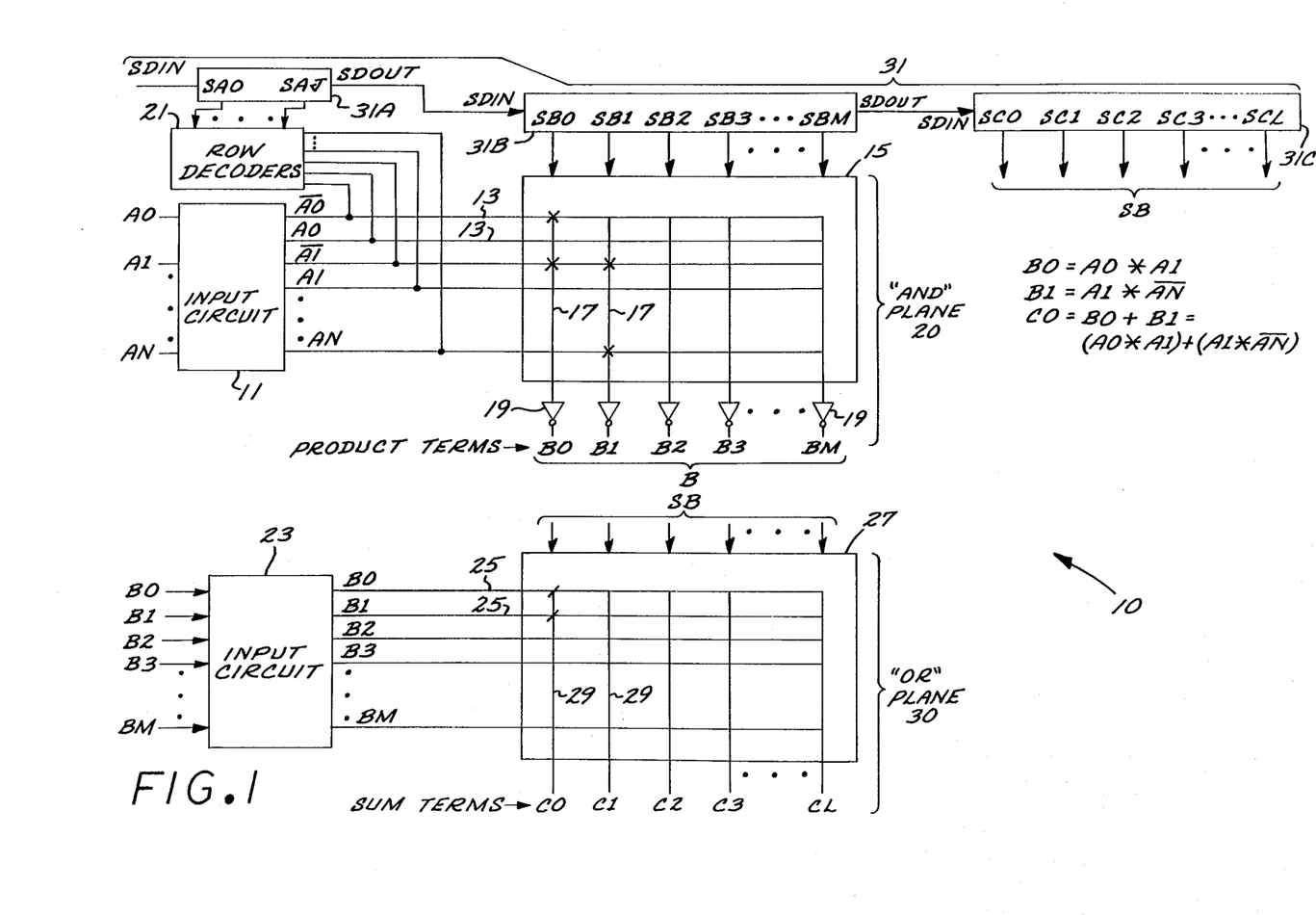
FIG. 1 is a schematic block diagram of the programmable logic array described herein.

Referring now to FIG. 1, shown therein is a schematic block diagram of a programmable logic array 10 of the invention which includes an input circuit for accepting a plurality of logic inputs A0 through AN. The input circuit 11 provides as outputs the logic inputs A0 through AN and their complements; namely, $\overline{A0}$, A0, $\overline{A1}$, A1, and so forth.

The outputs of the input circuit 11 are respectively provided as input lines 13 of an AND array 15, which provides OR combinations of selected ones of the inverted (negated) logic inputs on its input lines 13. The AND array 15 provides outputs on output lines 17 to a plurality of output inverters 19, which in turn provide outputs B0 through BM. The outputs B0 through BM are known as product terms.

The input lines 13 are schematically shown as horizontal lines, and the output lines 17 are schematically shown as vertical lines. As indicated by specific examples in FIG. 1, an "x" at the intersection of an input line 13 and an output line 17 indicates that the input on that particular input line 13 is a term in the OR combination whose output is provided on such output line 17. Thus, for example, the product term B0 is equal to (A0*A1), which is indicated by x's at intersections of (a) the input lines 13 for the logical inputs $\overline{A0}$ and $\overline{A1}$, and (b) the output line for the product term B0. The complements of the input signals A0 and A1 are utilized since, as discussed more specifically below, the AND array 15 in fact provides selected OR combinations of the logic signals on its input lines 13, which requires certain Boolean operations on the input and output signals in order to provide the desired AND combination.

The AND array 15 is referred to as the "AND" array since the combination of the circuit 11, the AND array 15 (which in fact provides OR combinations), and the output inverters 19 form the AND plane 20 of the programmable logic array 10. As is well known, programmable logic arrays are generally described in terms of an AND plane and an OR plane. The OR plane 30 of the logic array 10 is described further below.

As is also well known pursuant to the class of Boolean identities known as DeMorgan's theorem, the AND function can be equivalently provided by inverting the logic terms to be combined pursuant to the AND function, combining such inverted logic terms pursuant to the OR function, and inverting the result of the OR function. Such equivalency is provided by the input circuit 11, the AND array 15, and the output inverters 19 of the AND plane 20.

Referring again to the example of the product term B0 being (A0*A1), the corresponding OR combination provided by the AND array 15 is ($\overline{A0}$+$\overline{A1}$). Pursuant to DeMorgan's theorem, $\overline{A0}$+$\overline{A1}$, may be expressed as $\overline{(A0*A1)}$. Inversion of the latter by the output inverter 19 results in the product term (A0*A1).

The control outputs of address decoder circuits 21 are respectively connected to the input lines 13 of the AND array 15. As described more fully herein, the address decoder circuits 21 are utilized in the programming of the AND array 15.

The product terms B0 through BM are provided as inputs to an input circuit 23 which provides replicas of the product terms B0 through BM to the input lines 25 of OR array 27. As discussed more fully herein, the input circuit 23 functions to isolate the output inverters 19 from a high programming voltage.

The OR array 27 provides OR combinations of selected ones of the product terms B0 through BN. The results of the OR combinations are called sum terms and are provided on output lines 29 of the OR array 27. In a manner similar to the AND array 15, an "x" at the intersection of an input line 25 and an output line 29 indicates that the input on that particular input line 25 is a term in the OR combination whose output is provided on such output line 29. Thus, as indicated by way of example on FIG. 1, the sum term C0 is equal to (B0+B1), which in terms of the inputs to the AND array 15 is [(A0*A1)+(A1*AN)].

The OR array 27 forms the OR plane 30 of the programmable logic array 10.

Referring to both the AND array 15 and the OR array 27, associated with the input lines and output lines are rows and columns of programmable cells which are selectively programmable to include selected inputs in the OR combination provided by an output. The cells in each array correspond to the intersections of the input lines and the output lines. Thus, the AND array 15 includes M+1 columns of cells, where each column includes 2(N+1) cells.

The cells of the arrays 15, 27 are individually programmable pursuant to row address information and programming information serially stored in a serial shift register latch (SRL) 31 which includes serially coupled sections 31A, 31B and 31C. The SRL section 31A includes stages SA0 through SAJ which provide address information to the row decoder circuit 21. The SRL section 31B includes stages SB0 through SBM which are respectively associated with the columns of programmable cells in the AND array 15. The SRL section 31C includes stages SC0 through SCL which are respectively associated with the columns of programmable cells in the OR array 27.

The input data to each of the stages of the SRL 31 is generally referred to as SDIN and the output of each stage is generally referred to as SDOUT. Thus, the SDOUT data provided by the stage SAJ of the SRL section 31A is provided as the SDIN data for the stage SB0 of the SRL section 31B. The serial data for the SRL 31 is input as the SDIN data to the stage SA0 of the SRL section 31A.

Briefly, the individual cells of the AND array 15 are programmed one row at a time. Row address information and programming information are serially input into the respective sections 31A and 31B of the SRL 31. The cells of the selected row as defined by the row address information are then programmed pursuant to a predetermined procedure, as discussed more fully herein. The procedure is then repeated with the next row to be programmed, if any.

After the AND array is programmed, the OR array 27 is programmed one row at a time. However, there is no separate row decoder for the OR array 27. Instead, the contents of the SRL stage 31B are controlled so that the product term outputs B0 through BM are utilized to select the row to be programmed. The programming information for the selected row of the OR array is stored in the SRL section 31C. Thus, in order to program one row of the OR array 27, the program information data and the row identification information are serially input to the SRL 31 sections 31B and 31C. When the appropriate information is present, the cells of the selected row are programmed pursuant to a predetermined procedure as more fully discussed herein.

Figure 2:
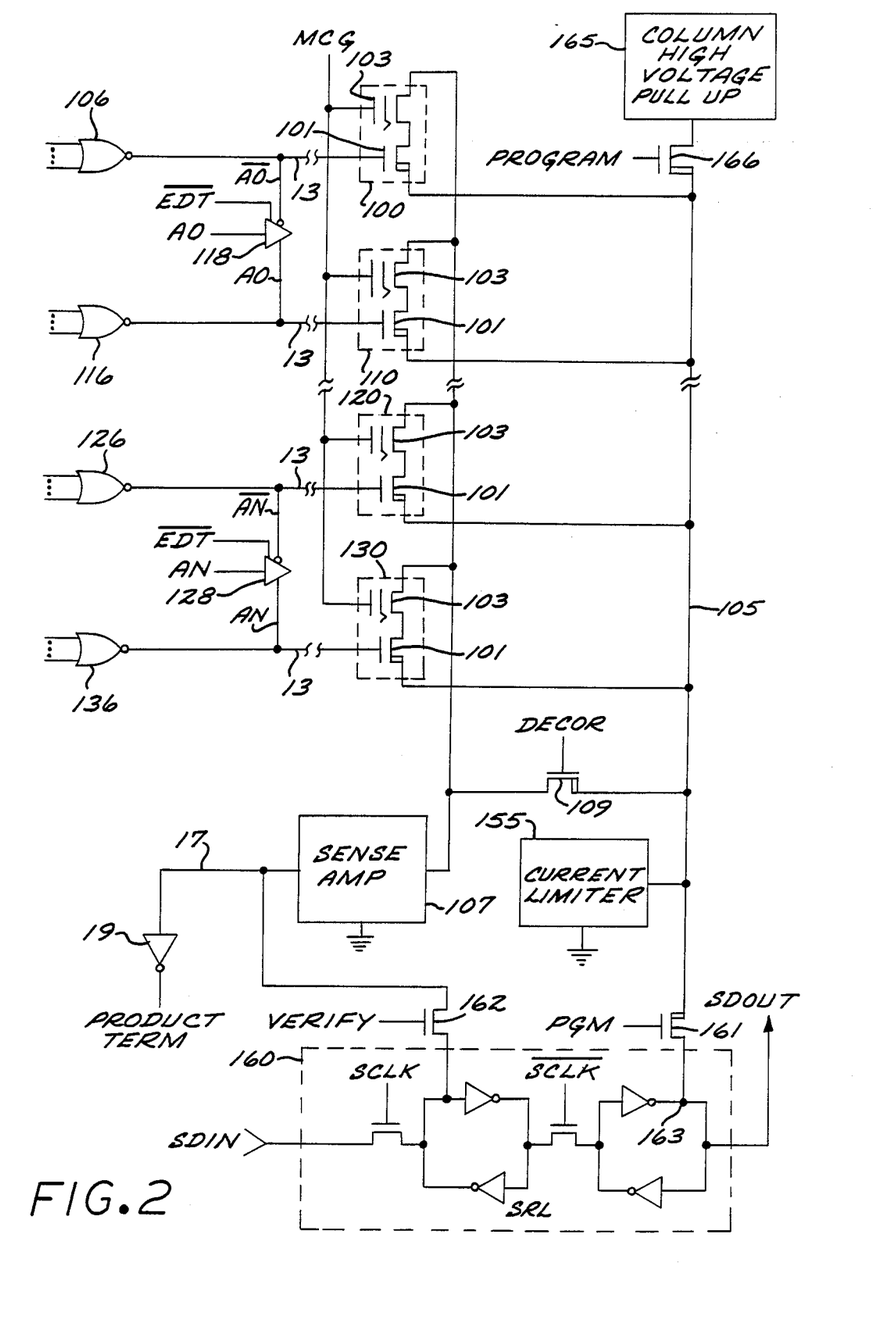
FIG. 2 is a simplified schematic diagram of the programming circuitry associated with one column of the AND array of the programmable logic array of FIG. 1.

Referring now to FIG. 2, shown therein are four cells 100, 110, 120, 130 of a column of cells of the AND array 15. FIG. 2 further includes a portion of the input circuit 11 and a portion of the row decoder circuit 21.

Each of the cells 100, 110, 120, 130 includes an N-channel select transistor 101 which is serially coupled with a floating gate sense transistor 103. The drains of all of the select transistors for the column of cells are coupled to array column ground line 105. The drains of all the sense transistors for the column of cells are coupled to the input of a column sense amplifier 107. For each of the cells 100, 110, 120, 130, the source of the select transistor 101 is coupled to the drain of the sense transistor 103. The gates of the sense transistors 103 are all coupled to a node MCG.

The input circuit 11 includes for each of the inputs A0 through AN a tri-state input driver, which for the inputs A0 and AN are respectively identified as the input drivers 118 and 128. The input drivers 118, 128 are controlled by an edit signal EDT, which when at a logical HIGH state causes the input drivers to be in the open state. When the edit signal EDT is LOW, the input drivers 118, 128 provide non-inverted (i.e., true) and inverted (i.e., complemented) versions of their respective inputs.

The input driver 118 provides the complement $\overline{A0}$ of the input signal A0 to the gate of the N-channel select transistor 101 of the cell 100, and further provides the non-inverted version of the input signal A0 to the gate of the N-channel select transistor 101 of the cell 110. The input driver 128 provides the complement $\overline{A1}$ of the input signal A1 to the gate of the N-channel select transistor 101 of the cell 120, and further provides the non-inverted version of the input signal A1 to the gate of the N-channel select transistor 101 of the cell 130.

It should be readily understood that the input lines 13 are further respectively coupled to the cells of respective rows of the other columns in the AND array 15.

The output of the sense amplifier 107 is provided as the input to the inverter 19 (also shown in FIG. 1) associated with the column of cells shown in FIG. 2. The output of the inverter is one of the product terms of the AND plane 20 (FIG. 1).

The row decoder circuit 21 includes for each of the input lines 13 a multi-input tri-state NOR gate which is controlled by the edit signal EDT to be enabled when the EDT signal is HIGH. When the edit signal EDT is LOW, the tri-state NOR gates are in the open state. Specifically, the outputs of the NOR-gates 106, 116, 126, 136 are respectively coupled to the inputs lines 13 associated with the cells 100, 110, 120, 130. By way of example, 78 seven-input NOR gates would be utilized to uniquely address each of 78 rows (of a possible 128 rows).

As indicated previously, each column of cells in the AND array 15 (FIG. 1) has an associated shift register stage in the SRL section 31B (FIG. 1). A representative stage 160 is shown in FIG. 2 for the exemplary column of cells shown therein. As referred to previously, programming data is serially shifted into the SRL 31, and programming information for one of the cells in FIG. 2 will be present at the latched node 163 of the shift register stage 160.

Further associated with the column of cells shown in FIG. 2 are programming transistors 161 and 166. The transistor 166 is gated by a PROGRAM signal which is at 20 Volts when it is HIGH. The drain of the transistor 166 is coupled to the column ground line 105, and the source of the transistor 166 is coupled to a high voltage pull-up circuit 165. The programming transistor 161 is gated by a PGM signal which is at 5 volts when it is at a logical HIGH. The transistor 161 has its source coupled to the latched node 163 of the shift register stage 160, and has its drain coupled to the column ground line 105.

Continuing to refer to the circuit of FIG. 2, a decoding transistor 109 is coupled between the input to the sense amplifier and the column ground line 105. As will be discussed in the context of programming the OR array 27 of FIG. 1, the transistor 109 is selectively enabled by a decode OR signal DECOR and is utilized for selecting the row of the OR array to be programmed.

It should be readily understood that circuit elements shown in FIG. 2 are replicated to form the column of cells in the AND array 15 (FIG. 1) and to form the SRL section 31A (FIG. 1).

During a device "edit" mode, the $\overline{EDT}$ signal goes low, disabling the input drivers 118,128 and enabling the row decoders 106,116,126,136. The inputs to the row decoders from the shift register stage 31A comprise a row address word selecting one of the rows, gating the select transistors 101 in that row to the conductive state. To bulk erase, the MCG node is raised to +20 volts, and the data node 163 of the shift register stage 160 is at a logical LOW. The transistor 161 is turned on with a high "PGM" signal. For each of the cells, the gate of the sense transistor 103 will be at +20 volts and its drain will be grounded, causing electrons to tunnel to the floating gate from the drain, programming the transistor to the enhancement mode, with a threshold gate turn-on voltage of 6–8 volts (the "erased" state). The sense transistor 103 will not conduct when an interrogation voltage, nominally +2.5 volts, is applied to its gate via the MCG node during the device normal user and verify modes (discussed further herein).

To program a selected cell, the gate of the select transistor is pulled to +20 volts by the row decoder, the MCG node is grounded, and the data at node 163 is high. With both transistors 161, 166 turned on with respective high "PGM" (+5 volts) and "PROGRAM" (+20 volts) signals, the pull-up circuit 165 pulls up line 105 to +20 volts minus $V_T$, the turn-on threshold voltage of transistor 166. With its control gate grounded and its drain at +20 volts minus $V_T$, electrons will tunnel to the drain from the floating gate of the sense transistor 103, programming it to the depletion mode. In the normal user and verify modes, with the nominal 2.5 volt gate interrogation level, the sense transistor will be conductive.

When the programmable logic array 10 is being utilized in the normal user mode, $\overline{EDT}$ is high, disabling the row decoders 106, 116, 126, 136 and enabling input drivers 118, 128. In this mode, "PGM" and "PROGRAM" are low, so that transistors 161, 166 are nonconductive, and the current limiter 155 is enabled, providing a path to ground for line 105.

The sense amplifier 107 provides a two-state output signal, in dependence on the status of the memory cells in the respective product line. From FIG. 2, it is apparent that each of the sense transistors 103 for a particular column are coupled in parallel (through the respective select transistors 101) between the input to the sense amplifier 107 and the column ground line 105. If all sense transistors 103 are erased, i.e., non-conductive when interrogated by an interrogation voltage on line MCG driving the gates of the sense transistors, then no current will flow between the input to the sense amplifier 103 and the column ground line 105. If one or more of the selected sense transistors 103 is programmed to the conductive state, then one or more current paths is provided between the input to the sense amplifier 107 and ground line 105.

In the normal user mode, the high level of the product term associated with a particular column of cells of the AND array 15 is based on the programmed cells being read in that column.

Figure 3:
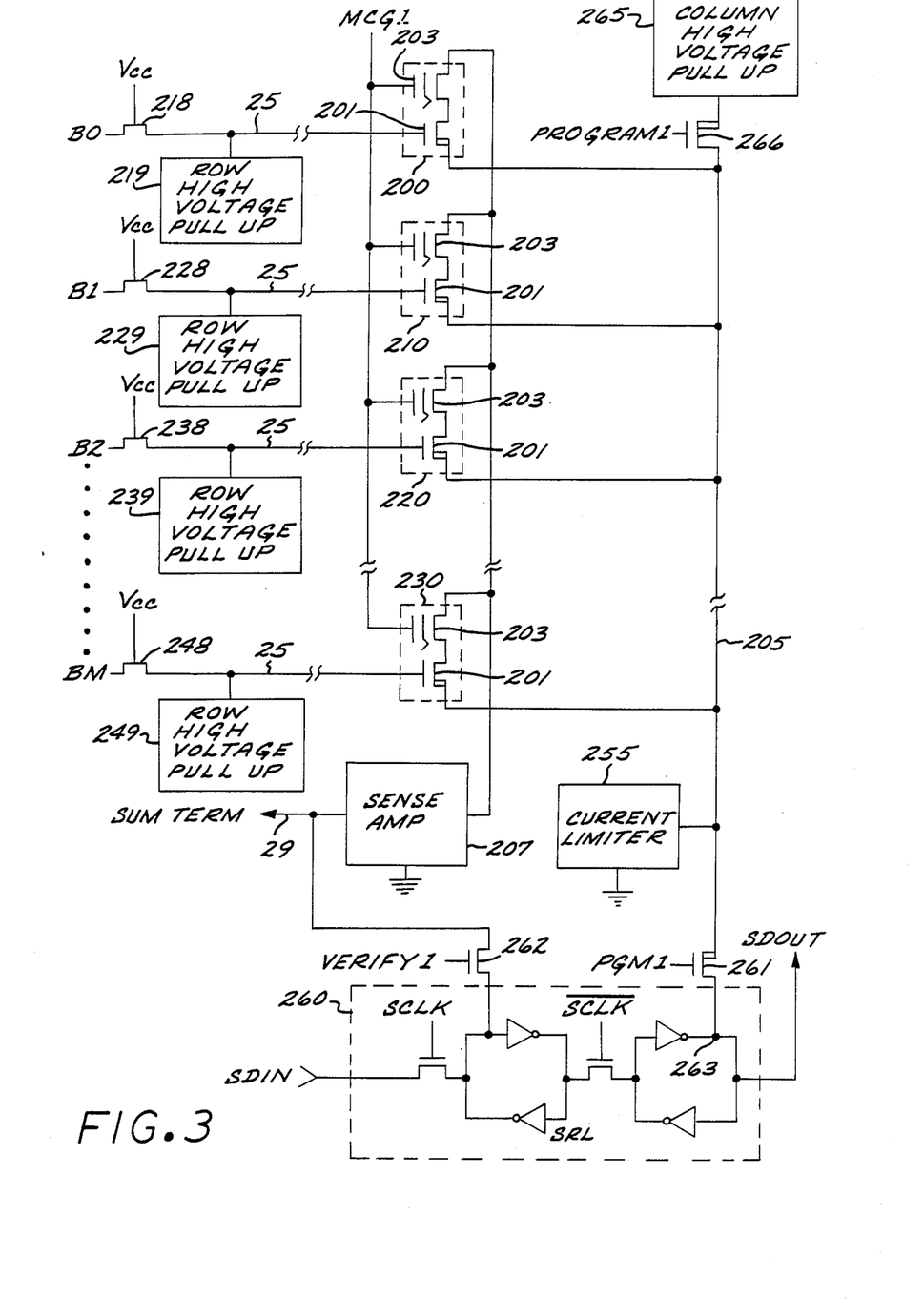
FIG. 3 is a simplified schematic diagram of the programming circuitry associated with one row of the OR array of the programmable logic array of FIG. 1.

Referring now to FIG. 3, shown therein are four cells 200, 210, 220, 230 of a column of cells of the OR array 27. FIG. 3 further includes a portion of the input circuit 23.

Each of the cells 200, 210, 220, 230 includes an N-channel select transistor 201 which which is serially coupled with a floating gate sense transistor 203. The drains of all the select transistors 201 for the column of cells are coupled to array column ground line 205. The drains of all the sense transistors 203 for the column of the cells are coupled to the input of a column sense amplifier 207. For each of the cells 200, 210, 220, 230, the source of the select transistor 201 is coupled to the drain of the sense transistor 203. The gates of the sense transistors 203 are coupled to a node MCG1.

The output of the sense amplifier 207 is one of the sum terms of the OR plane 30 (FIG. 1) provided on an output line 29.

The input circuit 23 includes for each of the inputs B0 through BN respective isolation transistors 218, 228, 238, 248 which are respectively coupled to the input lines 25 associated with the cells 200, 210, 220, 230. The gates of the isolation transistors 218, 228, 238, 248 are are coupled to a logical HIGH signal having a potential of 5 volts. The input lines 25 are further coupled to respective row high voltage pull-up circuits 219, 229, 239, 249 which are utilized to selectively raise the voltage on the input lines 25 up to 20 volts when the OR array 27 is being programmed.

It should be readily understood that the input lines 25 are respectively coupled to respective cells of other columns of the OR array 27.

Each of the isolation transistors 218, 228, 238, 248 functions as follows. When the product term coupled to an isolation transistor is LOW, the associated input line 25 is held LOW, even when the associated high voltage pull-up circuit is active and attempting to provide providing 20 volts. When the product term coupled to an isolation transistor is HIGH, the associated input line 25 will be HIGH, but the actual voltage level depends on whether the associated high voltage pull-up circuit is active. If the associated high voltage pull-up circuit is active, as when programming the OR array 27, then a HIGH product term will result in a HIGH signal of 20 volts on the associated input lines 25. If the associated high voltage pull-up circuit is not active, then a HIGH product term will result in a HIGH signal at 5 volts minus an N channel threshold on the input line 25.

As indicated previously, each column of cells in the OR array 27 (FIG. 1) has an associated shift register stage in the SRL section 31C (FIG. 1). A representative stage 260 is shown in FIG. 3 for the exemplary column of cells shown therein. As referred to previously, row address information and column programming data are respectively serially shifted into the SRL sections 31B and 31C, and programming information for one of the cells in FIG. 3 will be present at the node 263 of the shift register stage 260.

Further associated with the column of cells shown in FIG. 3 are programming transistors 261 and 266. The transistor 266 is gated by a PROGRAM1 signal which is at 20 volts when it is HIGH. The drain of the transistor 266 is coupled to the column ground line 205, and the source of the transistor 266 is coupled to a high voltage pull-up circuit 265. The programming transistor 261 is gated by a PGM1 signal which is at 5 volts when it is at a logical HIGH. The transistor 261 has its source coupled to the node 263 of the shift register stage 260, and has its drain coupled to the column ground line 205.

It should be readily understood that the circuit elements shown in FIG. 3 are replicated to form the columns of cells in the OR array 27 (FIG. 1) and to form the SRL section 31C (FIG. 1).

The OR matrix row pull-up circuits 219, 229, 239, 249 operate in cooperation with the product terms to select the row of the OR array 27 to be programmed during a programming cycle. A row driven at a HIGH logic level by the product term inverter 19 will be pulled up to the high programming voltage provided by the pull-up circuit, while a row driven at a LOW logic level by the inverter will remain at the LOW level, the deselected condition. The pull-up circuits are configured as weak pull-up circuits so that the inverters 19 may outdrive them.

The OR array 27 is programmed in the following manner. The cells in the array 27 are first bulk erased to the non-conductive state, i.e., all the floating gate transistors of the cells in the array are erased to the non-conductive state during a single programming cycle. To bulk erase, the MCG1 node is raised to +20 volts, and the stages 260 of the SRL 31C are loaded with data to bring the data nodes 263 of the stages to the logic LOW level. The stages 160 of the SRL 31B are loaded with data to bring the data node 163 of each stage to the logic LOW level. Referring to circuitry in FIG. 2, with the DECOR signal at the logic HIGH level, the transistor switches 109 will be conductive, passing the data at the nodes 163 through the sense amplifiers 107 and inverter 19 to result in a logic HIGH signal on each of the product terms B0-BM. The gates of each of the select transistors 201 (FIG. 3) will be pulled up to +20 volts by the respective pull-up circuits 219, 229, 239, 249, so that each transistor 201 will be in the conductive (selected) state. For each of the cells of the array 27, the gate of the sense transistor 203 will be at +20 volts and its drain will be grounded, causing electrons to tunnel to the floating gate from the drain, programming the sense transistors to the enhancement mode, with a threshold gate turn-on voltage of 6-8 volts. The sense transistor 203 in this state will not conduct when an interrogation voltage, nominally +2.5 volts, is applied to its gate during the device normal user and verify modes.

To program the OR array to the desired configuration, the SRL 31C is loaded with data representing the states of the cells of the first row to be programmed. The SRL 31B is loaded with a field of logic HIGH level "1's" except for a logic LOW "0" for the row to be programmed. The DECOR signal is brought to the HIGH logic level, gating the transistor switches 109 to the conductive state so that the data conditions at the data nodes 161 of the stages 160 of SRL 31B are passed through the respective sense amplifiers 107 and inverted by inverters 19. Thus, after the inversion, only one product term will be at the HIGH logic level, and this high product term selects the OR array row to be programmed. For those product terms at a logic LOW level, the corresponding input lines 25 will be pulled down to ground, so that the respective select transistors 201 in these (non-selected) rows are non-conductive, isolating the corresponding sense transistors from the programming circuitry.

For that product term at the logic HIGH level, the input line 25 is pulled up to +20 Volts by the corresponding row pull-up circuit, gating the select transistors 201 of each cell in the selected row to the conductive state. The sources of the respective sense transistors 203 are then coupled to the data node 263 of the corresponding stage 260 of SRL 31B. The data node 263 of this stage will be at the logic HIGH level to program the cell to the conductive state if this is the intended condition for this cell. The pull-up circuit 265 pulls up line 105 to $+20-V_T$ volts. The MCG1 node is brought to ground. With its control gate grounded and its drain at $+20-V_T$ volts, electrons will tunnel to the drain from the floating gate, programming the sense transistor to the depletion mode. In the normal user and verify modes, with the nominal 2.5 volt gate interrogation level, the sense transistor will be conductive. If the cell is to be left in the erased state so that it is non-conductive during interrogation, the data node 263 of the stage 260 of SRL 31B will be at the logic LOW level, pulling line 205 to ground. With its gate and drain at ground, the charge level on the floating gate of the transistor will be undisturbed, so that it remains in the enhancement mode.

Reference has been made to the normal user mode of the programmable logic array disclosed herein. This refers to the normal operating mode of the device, during which the device performs logical operations on the logical input signals applied to the arrays, and provides logical outputs representing the results of these logical operations. During the normal user mode, the sense transistors in the cells are interrogated by respective MCG and MCG1 signals at +2.5 volts. The EDT, CLR, VERIFY, PROGRAM, PGM, PROGRAM1, PGM1, VERIFY1 and DECOR signals are inactive at the LOW state during the normal user mode, and the $\overline{EDT}$ signal is HIGH. Thus, in this mode the row drivers are active, the SRL stages are disconnected from the arrays, the row decoders are disabled, and the high voltage pull-up circuits are all inactive.

The verify mode is employed to read the conditions of the sense transistors in the array and to shift this data out of the SRL to the external SDOUT port for observation and verification against the expected data patterns. In this mode, to verify the AND array cells, the MCG and MCG1 signals are at the cell interrogation levels (+2.5 volts), the EDT and VERIFY1 signals are active, and the CLR, PROGRAM, PGM, PROGRAM1, PGM1 and DECOR signals are inactive. The row drivers are inactive, and the row decoders are active to select one row whose cells are to be read. The pass transistors 162 of the SRL stages 160 of SRL 31B are conductive to pass the state of the respective sense amplifier 107 output into the input of the SRL stage 160. This state will reflect the conductive/non-conductive state of the cell in the selected row. The SRL non-overlapping clocks SCLK and $\overline{SCLK}$ are then activated to read the contents of the SRL 31B out of the SDOUT port.

The conditions of the OR array cells may also be verified during the verify mode, in a similar manner with the corresponding control signals, except that the DECOR signal becomes active and data is shifted into the SRL 31B to select one of the OR array rows to be verified, in a manner similar to that described above with respect to programming. Thus, the EDT, PROGRAM, PROGRAM1, PGM1 and VERIFY are all inactive LOW and the PGM, DECOR and VERIFY 1 signals are HIGH to read the conditions of the respective cells of the selected OR array row into the SRL 31C. The contents of SRL 31C are subsequently shifted out of the SDOUT port for observation and comparison against the expected data pattern.

To improve the testability of programmable logic arrays such as the one described above with respect to FIGS. 1-3, means are provided for bulk stripe programming of the AND array cells. As used herein, "bulk stripe programming" refers to the programming of all cells in one-half the rows of the AND array 15 during one programming cycle.

Utilization of bulk stripe programming substantially reduces the time required to test the programmable logic device. Because the input lines of the AND array 15 are driven by true and complement versions of the device input signals, one-half of the rows are selected at any given time, so that one-half of the cells on each AND array column are being "read." The polarity of the device input signal determines which rows are selected, and accordingly which half of the cells are being read. It is therefore very useful to have stripes of conductive cells in the AND array for testing purposes.

The bulk stripe programming means comprises the row address decoder circuits 21, one decoder for each of the rows of the AND array 15, and buffer circuitry for driving the decoders. Exemplary row address decoder circuits 200 and 220 shown in FIG. 4 perform a NOR decode function, wherein the decoder output is at the HIGH state only when all inputs to the decoder are low. The row address information from the SRL 31A drives the buffer circuits, and comprises a plurality of data bits, the number dependent on the number of rows. For example, for 78 rows in the AND array, seven bits are required to select 1 of the 78 rows. The row address bits or word is referred to as the RAG word. The SRL section 31A is similar to sections 31B and 31C, with the data node of each stage providing the particular RAG bit for the stage.

Figure 4:
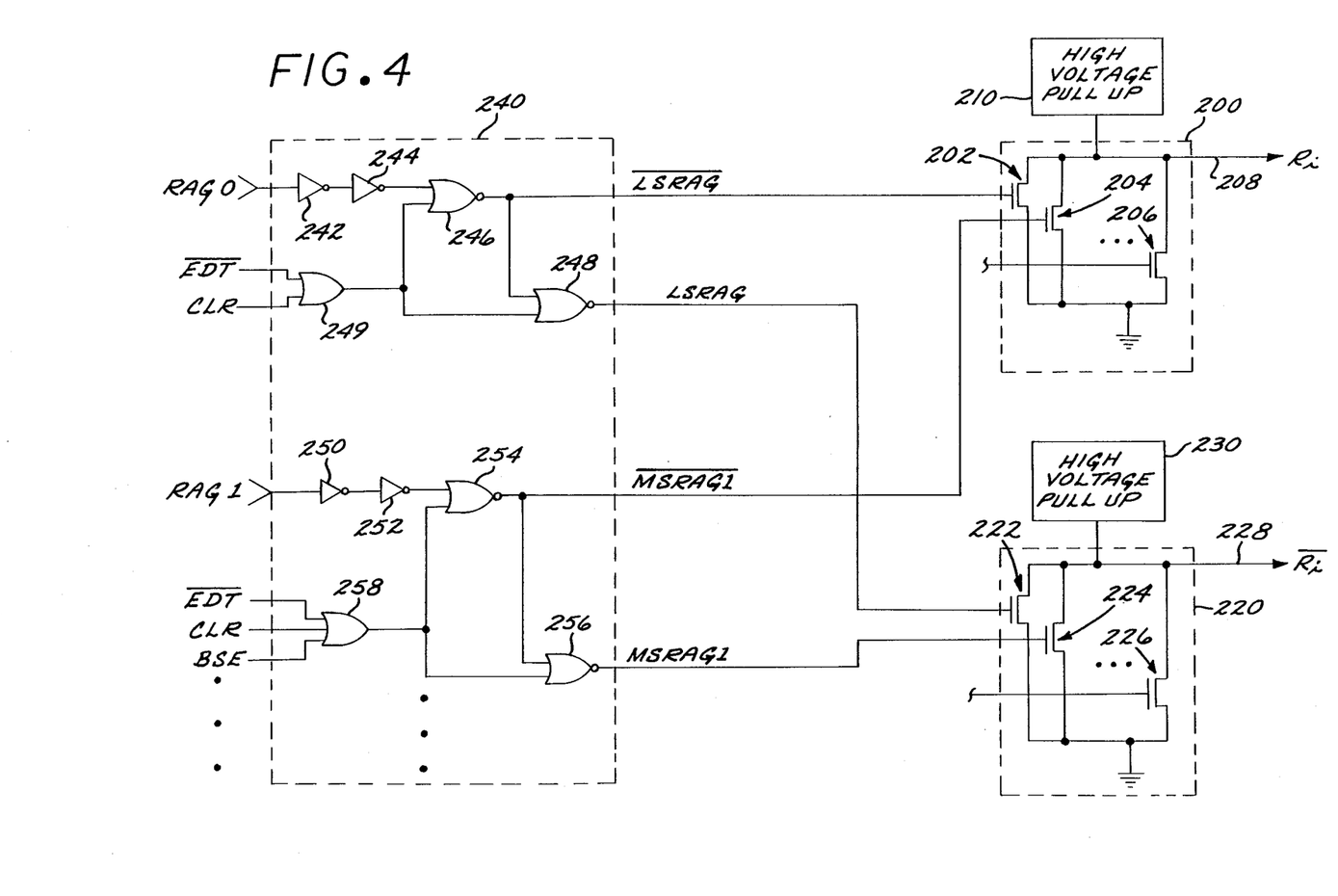
FIG. 4 is a simplified schematic diagram of an AND array row decoder and buffer circuitry for the programmable logic array of FIG. 1.

FIG. 4 illustrates two exemplary row decoders 200, 220 and associated row address buffer logic circuit 240. The illustrated decoders represent one decoder pair coupled to complementary rows whose cells are selected by the respective true and complement versions of a particular device input signal. Only the decoders for two rows are shown in FIG. 4, it being understood that the circuits of FIG. 4 may be replicated to provide the additional row decoders needed for a particular array size. For example, if the array has 78 rows, then 39 pairs of the row decoder circuits 200, 220 are provided, and a 7 bit RAG word is required to uniquely define 1 of the 78 rows.

Row decoder 200 comprises a plurality of N-type transistors, including transistors 202, 204, and 206, coupled between the decoder output line 208 and ground. A high impedance, high voltage pull-up circuit 210 is connected to output line 208. Similarly, decoder 220 comprises a plurality of N-type transistors, including transistors 222, 224, and 226, coupled between the decoder output line 228 and ground. The number of transistors is determined by the number of bits in the RAG word; if the RAG word has seven bits, seven transistors are provided to be gated by respective ones of the bits or the bit complements.

The decoder output lines 208, 228 are respectively coupled to the gates of all the select transistors for the memory cells in the particular row, i.e., input line 13. Thus, for example, the decoder output signal $R_i$ on line 208 might drive the gates of all select transistors 101 associated with Row 1, and the decoder output signal $\overline{R_i}$ on line 228 might drive the gates of all select transistors 101 associated with Row 2. For this example, it is further assumed that the array input signals driving Rows 1 and 2 represent the true and complement values of a first device input signal, e.g., AO.

When a row decoder output is active to select a row, its output line is at the potential of the high voltage pull-up circuit, typically +20 volts, gating the select transistors 101 of the selected row to the conductive state. If the row decoder is not active, the decoder output line will be at ground, so that the select transistors in that row will be non-conductive.

Logic circuit 240 receives the respective bits comprising the RAG word, the control logic signal $\overline{EDT}$, the clear signal CLR, and the bulk stripe enable signal BSE, and provides the signals which drive the row decoders.

For the example of the 78 row array, the RAG word comprises bits RAG0-RAG6, with RAG0 representing the least significant bit of the RAG word, and RAG-1-RAG6 representing the more significant bits. For simplicity, only the RAG0 and RAG1 bits and corresponding buffer circuitry are shown in FIG. 4. The signal RAG0 is coupled through inverters 242 and 244 to NOR gate 246. The output of OR gate 249, with the $\overline{EDT}$ and CLR signals as inputs is also provided as an input to the NOR gate 246. The output of the gate 246 is the signal $\overline{LSRAG}$, and is coupled to the gate of the transistor 202 of decoder 200. The output of gate 246 also is coupled as one input to OR gate 248, with the output of OR gate 249 provided as another input. The output of gate 248 is the signal LSRAG which is coupled to the gate of the transistor 222 of decoder 220.

The bit RAG1 of the RAG word is coupled through inverters 250 and 252 to an input of the NOR gate 254 whose output is the signal $\overline{MSRAG1}$, which gates transistor 204 of the decoder 200 and is provided as an input to gate 256. The output of OR gate 258, with the signals $\overline{EDT}$, CLR, BSE as inputs, is another input to the NOR gates 254 and 256. The output of the gate 256 is the signal MSRAG1, which gates transistor 224 of row decoder 220.

The transistors 206, 226 of decoders 200, 220 are gated by corresponding signals (not shown) developed by logic identical to that formed by inverters 250, 252, OR gate 258 and NOR gate 254, 256, except that the RAG2 bit drives the logic instead of RAG1. This logic is replicated for each of the bits RAG3-RAG6 to provide corresponding signals MSRAGi, $\overline{MSRAGi}$ (i=3, 4, 5, 6).

The buffer circuitry 240 and the decoder circuits 200, 220 cooperate in the following manner. During normal device operation, the $\overline{EDT}$ signal is at the high logic level, so that the outputs of the NOR gates 246, 248, 254, 256 are all at the low logic level. In this case, with the USF and CLR signals also at the low logic level, each row decoder is inactive with the respective transistors of the decoders in the non-conductive state, and with the high voltage pull-up circuits 210, 230 also inactive and isolated from the row output line. The row output line is then effectively tri-stated, i.e., at a high impedance condition, so that the row decoders are not in contention with the row input drivers.

In the programming mode, $\overline{EDT}$ and CLR are at the low logic levels, and the outputs of NOR gates 246, 248, 254, 256 reflect the logic levels according to the respective RAG0 and RAG1 bits. The row decoders select one of the AND array rows in dependence on the value of the RAG word for programming, verification or the like. During the bulk stripe programming mode, the BSE signal is high, driving the outputs $\overline{MSRAG1}$ and MSRAG1 of NOR gates 254 and 256 low irrespective of the state of the RAG1 bit. Because the BSE signal does not gate the NOR gates 246, 248, the $\overline{LSRAG}$ and LSRAG signals are still active during the bulk stripe programming mode. Thus, depending on the state of the least significant bit of the row address information in the SRL 31A, either the even or odd rows of the AND array will all be selected. A programming cycle is then carried out to program all the selected even or odd row cells to the conductive state in one programming cycle.

Once bulk stripe programming has been employed to program either the even or odd rows of the AND array 15 to the conductive state, all cells in the OR array 27 forming the sum terms CO-CL (FIG. 1) are programmed to the conductive state. Thus, the cells in the AND array programmed to the conductive state will contribute to the logical outputs of both arrays when interrogated, and the cells in the AND array programmed to the non-conductive state will not contribute to the logical outputs of the arrays when interrogated. The device inputs to the AND array 15 are selected such that all AND array rows whose cells are conductive when interrogated are driven by LOW logic levels, and all rows whose cells are non-conductive when interrogated are driven by HIGH logic levels. In this condition, the cells programmed to contribute to the logical outputs are not interrogated, and those cells programmed not to contribute to the logical outputs are interrogated. The outputs of all the AND array sense amplifiers 107 should be at the LOW logic level, and the inverter 115 outputs will be HIGH, so that all device sum term outputs will also be HIGH.

To test the device input circuitry (such as input registers), each device input signal is toggled, from the LOW to the HIGH logic level and then back to the LOW state, or vice versa depending on whether all even or all odd rows were bulk stripe programmed, one device input signal at a time, so that the row whose cells are conductive should cause all device sum term outputs to change states from the LOW to HIGH to LOW states. Each of the other device inputs is in turn toggled to test the remaining ones of the programmed rows. Thus, if the odd AND array rows are driven by the true versions of the device input signals, and the even rows by the complement versions, if the odd rows are bulk stripe programmed, then the device inputs are all LOW and sequentially toggled HIGH then LOW. If the even rows have been programmed, then all device inputs are initially HIGH, and then sequentially toggled LOW and then HIGH. Then a bulk erase of the AND array cells is performed, and bulk stripe programming is employed to bulk stripe program the other half of the cells, and the test procedure is repeated.

Programmable logic arrays often employ registered inputs, i.e., a register is typically placed between the device input pad and the row driver. A reset function provides a known register condition on device power-up. Using bulk stripe programming allows the manufacturer to quickly validate that the input registers power up to the proper state by employing the test procedure described above and observing the device output states in conjunction with the programmed OR array data.

With the bulk stripe programming techniques, input buffer and row defects can be identified in just two program and two erase cycles. Without bulk stripe programming, separate programming cycles for each row and two erase cycles would be required. For a typical program cycle time of 10 milliseconds and a 78 row array, this is a difference of about 40 milliseconds versus about 800 milliseconds.

It is understood that the above-described embodiment is merely illustrative of the possible specific embodiments which can represent principles of the present invention. Other arrangements can readily be devised in accordance with these principles by those skilled in the art without departing from the scope of the invention.

What is claimed is:

1. A programmable logic array comprising:
a first array having a plurality of first cells arranged in rows and columns for providing first logical outputs respectively associated with the columns of said first cells, said logical outputs including first logical combinations of logical inputs respectively available at said first cells of respective rows, said first logical combinations being of selectively programmed ones of said first cells in respective columns;
a second array having a plurality of second cells arranged in rows and columns for providing second logical combinations of said first array logical outputs respectively available at said second cells of respective rows, said second logical combinations being of selectively programmed ones of said second cells in respective columns;
storage means for selectively storing either (a) first array row address information and first array row programming information, or (b) second array row address information and second array row programming information;
row addressing means responsive to said first array row address information and associated with said first array for selectively enabling a selected row of said first array for programming pursuant to said first array row programming information stored in said storage means;
switching means respectively associated with said columns of cells of said first array for controlling said first logical outputs to alternatively provide said second array row address information as said first array logical outputs; and
means responsive to said second array row address information contained in said first array logical outputs for enabling the programming of a selected row of said second array pursuant to said second array programming information stored in said storage means.

2. The programmable logic array of claim 1 wherein each of said first array cells includes an MOS select transistor and an MOS floating gate transistor, wherein said select transistor receives one of said logical inputs and wherein said floating gate transistor is selectively programmed to be conductive or non-conductive.

3. The programmable logic array of claim 1 wherein each of said second array cells includes an MOS select transistor and an MOS floating gate transistor, wherein said select transistor receives one of said first array logical outputs and wherein said floating gate transistor is selectively programmed to be conductive or non-conductive.

4. The programmable logic array of claim 1 wherein said storage means comprises a serial shift register having a first section of respective stages for the columns of cells of said first array, said respective stages selectively storing either (a) said first array row programming information or (b) said second array row address information.

5. The programmable logic array of claim 4 wherein said storage means further includes a second section of respective stages for the columns of cells of said second array for storing said second array row programming information.

6. The programmable logic array of claim 5 wherein said switching means includes respective switched transistors for selectively causing the contents of said first section of respective stages of said serial shift register to control the logical states of said first array logical outputs.

7. The programmable logic array of claim 1 wherein said row addressing means comprises row address decoding circuitry respectively associated with the rows of cells of said first array.

8. A method for programming the cells of a programmable logic array having (a) a first array of cells arranged in rows and columns for providing first logical outputs respectively associated with the columns of first cells, where the first logical outputs include first logical combinations of logical inputs respectively available at the cells of respective rows, and (b) a second array of cells arranged in rows and columns for providing second logical outputs respectively associated with the columns of second cells, where the second logical outputs include logical combinations of the first logical outputs respectively available at the second cells of respective rows, comprising the steps of:
- (a) serially shifting into a shift register first array row selection information and program information for a selected row of cells of the first array to be programmed;
- (b) enabling the selected row of cells of the first array to store the program information contained in the shift register;
- (c) repeating the foregoing steps (a) through (b) as required to achieve the desired programming of the first array of cells;
- (d) serially shifting into the shift register second array row selection information and program information for a selected row of the second array to be programmed;
- (e) enabling each of the logical outputs of the first array to respectively provide the row selection information to the second array of cells;
- (f) enabling the selected row of cells in the second array to store the program information contained in the shift register; and
- (g) repeating the foregoing steps (d) through (f) to achieve the desired programming of the second array of cells.

9. A method for functional testing of a programmable logic device having an array of electrically erasable and reprogrammable cells arranged in rows and columns, the programmable logic device providing logical outputs which include logical combinations of logical inputs provided to the electrically erasable array, comprising the steps of:
- (a) erasing the array cells so that none of the cells contribute to the logical outputs when interrogated;
- (b) programming in a single programming cycle the cells in a first set of alternating rows to contribute to the logical outputs when interrogated;
- (c) driving the device inputs with device input signals so that the logical inputs to the first set of rows are at a logical level which does not interrogate the cells of said rows and the logical inputs to the second set of rows are at the cell interrogation logical level;
- (d) comparing the logical outputs with an expected output signal pattern;
- (e) sequentially toggling the state of each device input signal and comparing the logical outputs with expected output signal patterns to verify the operation of the contributing cells and associated input circuitry;
- (f) erasing the array cells so that none of the cells in the first or second sets of rows contribute to the logical outputs when interrogated;
- (g) programming in a single programming cycle the cells in said second set of rows to contribute to the logical outputs when interrogated;
- (h) driving the device inputs with device input signals so that the logical inputs to the first set of rows are at the cell interrogation logical level, and the logical inputs to the second set of rows are at a logical level which does not interrogate the row cells; and
- (i) repeating steps (d) and (e).

10. The method of claim 9 wherein said step (a) comprises the step of erasing all cells of the array to a first state wherein the cells do not contribute to the logical outputs when interrogated, and wherein said step (b) comprises the steps of:
- (i) selecting the cells in the first set of rows to be programmed to a second state wherein the cells contribute to the logical outputs when interrogated; and
- (ii) in a single programming cycle, programming said selected cells to the second state.

11. The method of claim 9 wherein said step (f) comprises the step of erasing all cells of the array to a first state wherein the cells do not contribute to the logical outputs when interrogated, and wherein said step (g) comprises the steps of:
- (i) selecting the cells in said second set of rows to be programmed to a second state wherein the cells contribute to the logical outputs when interrogated; and
- (ii) in a single programming cycle, programming the selected cells to said second state.

12. A programmable logic device for providing logical outputs which include logical combinations of device input signals, comprising:
- a plurality of device lines for receiving the device input signals;
- an input circuit coupled to the device input lines for providing logical array input signals which are true and complement versions of the device input signals;
- an array of electrically erasable and reprogrammable cells arranged in rows and columns, each row of cells being coupled to a particular one of said logical array input signals, said array providing logical combinations of the array input signals;
- means responsive to said array for providing logical outputs which include said logical combinations of the array input signals;
- means for selectively programming said cells to achieve a desired device logic configuration; and
- testing means for testing the operation of the programmable logic device, comprising means for bulk stripe programming in a single programming cycle all cells in rows associated with either the true or complement versions of the device input signals to a first state wherein the cells contribute to the logical outputs when interrogated.

13. The device of claim 12 wherein said programming means comprises:
- select means associated with each cell for selecting said cell to be erased or programmed during a particular programming cycle;
- row addressing means responsive to a row address word comprising a least significant bit and at least one other more significant bit, said word defining a particular one of the array rows to said first state and selecting the cells in said defined row; and
- programming circuitry arranged to program particular ones of the cells in said defined row to said first state in dependence on programming data defining which cells in the defined row are to be programmed.

14. The device of claim 13 wherein said testing means comprises means coupled to said row addressing means and responsive to a bulk stripe signal for causing said row addressing means to select all cells in either all rows associated with true version or all rows associated with said complement versions, in dependence on the state of said least significant bit of said row address word.

15. The device of claim 14 wherein the even rows of said array are associated with respective ones of either said true or complement versions, and the odd rows of said array are associated with respective ones of the other of said true or complement versions, and wherein said means responsive to said bulk stripe signal causes either the odd array rows or the even array rows to be selected for programming in dependence on the state of said least significant bit.

* * * * *